United States Patent
Schaper (10) Patent No.: US 7,125,639 B2
(45) Date of Patent: Oct. 24, 2006

(54) MOLECULAR TRANSFER LITHOGRAPHY

(75) Inventor: Charles Daniel Schaper, Union City, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 784 days.

(21) Appl. No.: 09/898,521

(22) Filed: Jul. 3, 2001

(65) Prior Publication Data

US 2002/0123009 A1    Sep. 5, 2002

Related U.S. Application Data

(60) Provisional application No. 60/277,578, filed on Mar. 22, 2001, provisional application No. 60/273,535, filed on Mar. 7, 2001, provisional application No. 60/273,055, filed on Mar. 5, 2001.

(51) Int. Cl.
*G03C 3/00*    (2006.01)
*G03C 11/12*    (2006.01)

(52) U.S. Cl. ...................... 430/253; 430/258

(58) Field of Classification Search .............. 430/5, 430/306, 308, 256, 258, 253, 252, 254
See application file for complete search history.

(56) References Cited

U.S. PATENT DOCUMENTS

| | | | | |
|---|---|---|---|---|
| 3,637,377 A | * | 1/1972 | Hallman et al. | ............ 430/253 |
| 3,859,094 A | * | 1/1975 | Franer et al. | ............ 430/273.1 |
| 6,225,026 B1 | * | 5/2001 | Lifshitz et al. | ............ 430/308 |

OTHER PUBLICATIONS

Stephen Chou, Peter Krauss, & Preston Renstrom. "Imprint Lithography with 25-Nanometer Resolution", Science vol. 272, Apr. 5, 1996 pp. 85-87, USA.

Stephen Chou, Peter Krauss, & Preston Renstrom. "Nanoimprint Lithography", Journal of Vacuum Science & Technology B vol. 14(6), Nov./Dec. 1996 pp. 4129-4133, USA.

Babak Heidari, Ivan Maximov, Eva-Lena Sarwe, & Lars Montelius, "Large scale nanolithography using nanoimprint lithography", Journal of Vacuum Science & Technology B vol. 17(6), Nov./Dec. 1999 pp. 2962-2964, USA.

Jan Haisma, Martin Verheuen, Kees Van Den Heuvel, & Jan Van Den Berg, "Mold-assisted nanolithography: A process for reliable pattern replication", Journal of Vacuum Science & Technology B vol. 14(6), Nov./Dec. 1996 pp. 4124-4128, USA.

Thomas Whidden, David Ferry, Michael Kozicki, Enoch Kim, Amit Kumar, James Wilbur, & George Whitesides, "Pattern transfer to silicon by microcontact and RIE", in Nanotechnology vol. 7, 1996, pp. 447-451, UK.

James Wilbur, Amit Kumar, Hans Biebuyck, Enoch Kim, & George Whitesides, "Microcontact printing of self-assembled monolayers: applications in microfabrication", in Nanotechnology vol. 7, 1996, pp. 452-457, UK.

(Continued)

*Primary Examiner*—Saleha R. Mohamedulla
(74) *Attorney, Agent, or Firm*—Franklin Schellenberg (57) ABSTRACT

A method for the fabrication of patterned devices, in which a latent image is initially formed in a photosensitive material on a carrier, and the exposed material containing the latent image is physically transferred to a substrate before processing. Physical transfer is enhanced by the appropriate selection of coating surface properties and additional coating layers, and by processing steps, such as heating and UV exposure, to promote adhesion to the substrate and detachment from the carrier.

24 Claims, 12 Drawing Sheets

OTHER PUBLICATIONS

Younan Xia & George Whitesides, "Soft lithography", in Annual Reviews of Material Science vol. 28, 1998, pp. 153-184, USA.

Shinichi Ueki, Isao Ashida, & Hiroichi Kawahira, "New data processing of dummy pattern generation adaptive for CMP process", in Photomask and X-Ray mask Technology VI, H. Morimoto, ed. Proceedings of he SPIE vol. 3748, Apr. 1999 pp. 265-272, USA.

M. Colburn, S. Johnson, M. Stewart, S. Damle, T. Tailey, B. Choi, M. Wedlake, T. Michaelson, S.V. Sreenivasan, J. Ekerdt, & C. Grant Willson, "Step and flash imprint lithography: A new approach to high-resolution printing", in Emerging Lithographic Technologies III, Y. Vladimirsky, ed. Proceedings of he SPIE vol. 3676, Mar. 1999 pp. 279-389, USA.

P. Ruchhoeft, M. Colburn, B. Choi, H. Nounu, S. Johnson, T. Bailey, S. Damle, M. Stewart, J. Ekerdt, S.V. Sreenivasan, J.C. Wolfe, & C. Grant Willson, "Patterning curved surfaces: Template generation by ion beam proximity lithography and relief transfer by step and flash imprint lithography", Journal of Vacuum Science & Technology B vol. 17(6), Nov./Dec. 1996 pp. 2965-2969, USA.

* cited by examiner

Figure 1: Prior Art Lithography Processing

Figure 1: Prior Art Lithography Processing

FIGURE 5: Transfer of film from carrier to substrate.

FIGURE 6: Developed Photoresist.

MOLECULAR TRANSFER LITHOGRAPHY

RELATED INVENTIONS

This application relates to, claims the benefit of the filing date of, and incorporates by reference the United States provisional patent applications entitled "Micro-Transfer Lithography", No. 60/273,055, filed Mar. 5, 2001, "Production of Integrated Circuits Using Micro-Transfer Lithography via Intermediary Substrate", No. 60/273,535, filed Mar. 7, 2001, and "Molecular Transfer Lithography", No. 60/277,578, filed Mar. 22, 2001, which are all assigned to the assignee of the present invention.

The invention was made with government support under Grant (Contract) No. NAVY N66001-00-1-8930 awarded by the Defense Advanced Research Projects Agency (DARPA) and monitored by the Space and Naval Warfare Systems Center(SPAWAR), F49620-95-1-0525 awarded by DARPA and monitored by the Air Force Office of Scientific Research (AFOSR), and ECS-0000541 awarded by the National Science Foundation (NSF). The government has certain rights to this invention.

FIELD OF THE INVENTION

This invention relates to a new technique for pattern formation using a photosensitive process, and more particularly describes the application of this technique to the formation of microscopic patterns for the fabrication of integrated circuits and other microdevices.

BACKGROUND OF THE INVENTION

Many kinds of photosensitive imaging systems have been developed and found commercial application. The most common is photographic film, manufactured using a thin emulsion containing silver halide crystals coated onto a plastic or paper support material. Here, photoexposure creates microscopic changes in the silver halide crystal structure. These then serve as nucleation points for the transformation of silver halides into metallic silver during subsequent chemical processing, which develops this "latent image" into an image with far greater contrast and visibility.

Likewise, for integrated device fabrication, photosensitive polymers called photoresists are in common use. These materials are designed to change molecular weight with photoexposure, either by photo-induced crosslinking or photoinduced scission. For the processing of integrated devices, a substrate (often a silicon wafer, and often comprising partially fabricated devices as well) is coated with this polymer, and photoexposure to define a pattern for processing occurs. The regions of photoexposure can be defined using lenses and a photomask or reticle, but can also be done by contact printing with a mask placed directly against the photoresist. The "latent" image after exposure in this case is the polymer film with a variation in density, or molecular weight. The polymers of different molecular weight have different solubilities, and so development occurs when the photoresist is treated with a suitable solvent, and the more soluble material dissolves, leaving the less soluble material behind.

Although many other photosensitive imaging systems have been created, a common feature of all of them is that they place the photosensitive material on the substrate where it is ultimately to be exposed, developed and used.

This can lead to problems, especially for integrated circuit manufacturing. Integrated circuits are fabricated layer by layer, with the circuit elements in each layer defined by a separate lithographic process. After several layers have been manufactured, the circuit is no longer flat, but can have considerable topography. Although common photoresist coating techniques, such as spin coating, can work extremely well for flat, planar surfaces, it can be much more difficult to produce a uniform layer of photoresist on a surface with topography.

There are several reasons that a uniform photoresist layer is desired for lithography. First, it is commonly known that reflections from the front and rear surface of the photoresist layer optically interfere, and the overall reflectivity of the film can range from nearly 0% to almost 90%, depending on the exposure wavelength, coherence, and the layer thickness. Films of different thickness in areas of different topography will have different reflectivity, which means that different exposure doses are required to achieve identical results in the different areas. Furthermore, for the formation of microstructures, the depth of focus is often as small as the typical resist thickness. Focus conditions will therefore be different in areas of different topography.

In addition to this, residues of previous processing steps can contaminate subsequent photolithographic coatings. Chemically amplified resists, for example, are extremely sensitive to amines. A trace amount of amines on the surface can change the lithographic sensitivity by an order of magnitude. Other lithographic applications, such as the formation of amino acid sequences using lithographically defined patterns, may be even more sensitive to this contamination problem.

There have been several innovations to correct this in photolithography. One approach to the problem is to introduce space filling "dummy" features to the design layout, which have no electrical function but serve to make the layer more uniform in profile. This has been used with some success, as described, for example, in "New Data Processing of Dummy Pattern Generation Adaptive for CMP Process" by Shinichi Ueki et al., Proc. SPIE 3748, pp 265–272 (1999). These features are, however, fabricated at the same time as the electrically active features, and must therefore be of the same material as the layer itself (e.g. polysilicon or aluminum). These dummy features are therefore not always electrically inert, but can add unwanted capacitance and inductance to the neighboring circuit.

Other approaches have attempted to increase the depth of focus of the imaging system, using for example interference effects from phase-shifting masks. This has been described in Chapter 5 and the references therein of the book *Resolution Enhancement Techniques in Optical Lithography*, by Alfred K. K. Wong. This has also proven to be very useful in some circumstances. However, phase shifting masks are not inexpensive, and their use also introduces other problems in the IC design process.

Recently, there has been a new investigation into the limits of contact printing lithography, adapting techniques for stamping mass manufactured compact audio and video disks for stamping microdevices. Some of these have been described, for example, in "Step and Flash Imprint Lithography: A New Approach to High-Resolution Patterning," by C. G. Willson et al., Proc. SPIE 3676, pp 379–389, (1999) and "Imprint Lithography with 25-Nanometer Resolution" by Stephen Chou et al., Science 272, pp 85–87 (April 1996). These techniques have even been applied to novel curved surfaces in "Patterning curved surfaces: Template generation by ion beam proximity lithography and relief transfer by step and flash imprint lithography," by C. G. Willson et al, in J. Vac. Sci. Technol. B 17(6), pp 2965–2969, (1999).

Although these reflect a great degree of innovation and creativity, all have in common that a master pattern, such as a photomask or an imprint master, is created, and the pattern then directly transferred by some process into the final material

SUMMARY OF THE INVENTION

We propose here an alternative technique, in which the exposure of a photoresist layer is carried out on a separate, planar substrate, and in which this layer of material containing a latent image is then physically transferred to the final substrate for subsequent development and processing. We call this procedure Molecular Transfer Lithography.

The physical transfer of the exposed material is made possible by the suitable choice of a binding layer to the initial substrate, and by the use of an adhesion promotion layer placed between the photosensitive layer containing the latent image and the final substrate.

By carrying out coating and photoexposure using planar substrates under optimum imaging conditions, film thickness uniformity can be assured, depth of focus for microstructures is much less of a problem, and the risk of contamination is significantly reduced.

This also enables lithography on otherwise difficult surfaces, such as spheres or cylinders. This is done by initially pattering the photosensitive material on a planar but deformable surface under optimum exposure conditions, and then deforming the substrate (which can, for example, be a bendable plastic) to conform to the curved surface. The material with the pre-exposed latent image would then be directly transferred, without the need to invent techniques for the uniform coating of spheres and cylinders with photosensitive materials.

BRIEF DESCRIPTION OF THE DRAWINGS.

Note: All drawings in cross section are for illustration purposes only. The dimensions of the layers in these illustrations are not shown to scale, nor should any conclusion about the desired relative thickness of the layers be drawn from these illustrations.

DETAILED DESCRIPTION OF THE INVENTION

As indicated above, this invention is a new approach to the formation and subsequent development of latent images. Although the concept of forming a latent image is known in the art, and the processes for development here are not new, latent images are typically formed on the surfaces or substrates where they are to be developed. This is illustrated in FIG. 1. As FIG. 1 also shows, certain problems with uniformity of film thickness and substrate topography can have consequences for the final image as well, either from interference effects or from depth of focus problems.

Figure 1A:
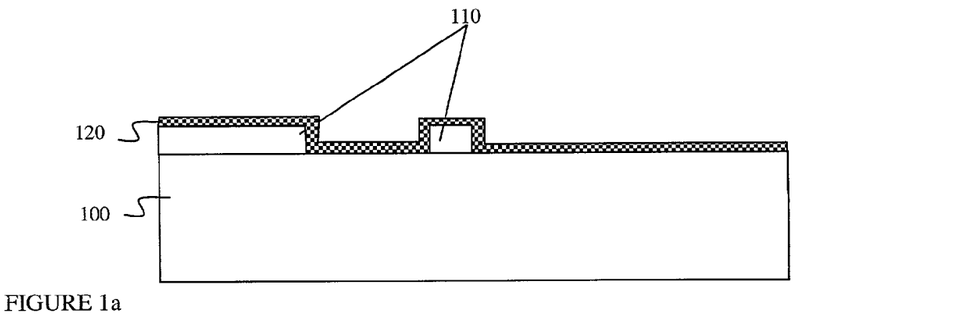
FIGS. 1a–1f show cross section diagrams illustrating the sequence of steps carried out in a typical prior art lithography process.
Figure 1B:
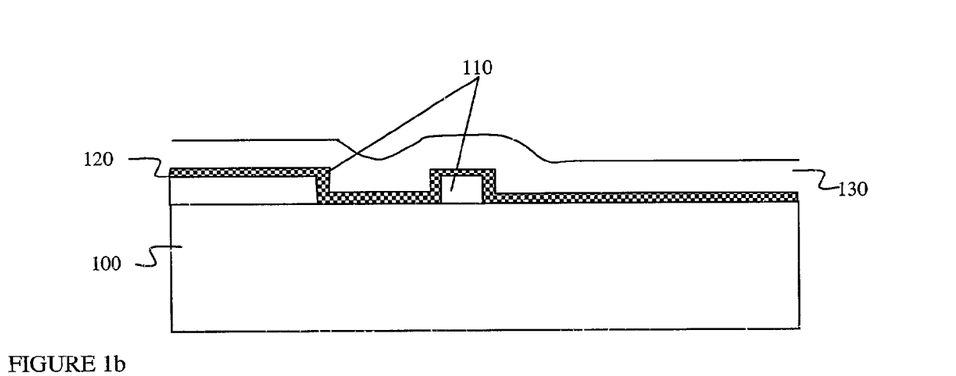

FIG. 1a shows a cross section of a substrate 100 with topography features 110, which has been processed with a layer 120 to be patterned using lithography. The next step is to apply a photosensitive material, typically a photoresist polymer to form a coating of photoresist 130. This material is not always perfectly conformal, as illustrated in FIG. 1b.

Figure 1C:
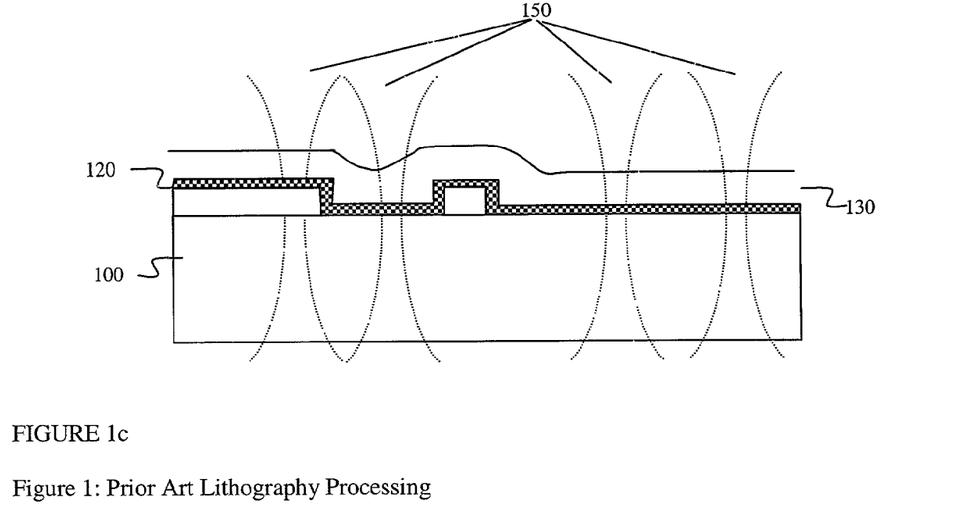

FIG. 1c shows exposure of the photosensitive material using selective exposure to photons or charged particles. Images are formed of several features on a photomask (not shown) by focussing the image on the surface of the layer 120 without topography. For this illustration, the images are of identical dimensions. Exposure of these identical features is shown schematically as identical exposure beams 150 with a waist at the point of smallest focus. The exposure is typically for a set duration of time, with a certain exposure fluence to deliver a specified dose of photons or charged particles to the photosensitive material.

Figure 1D:
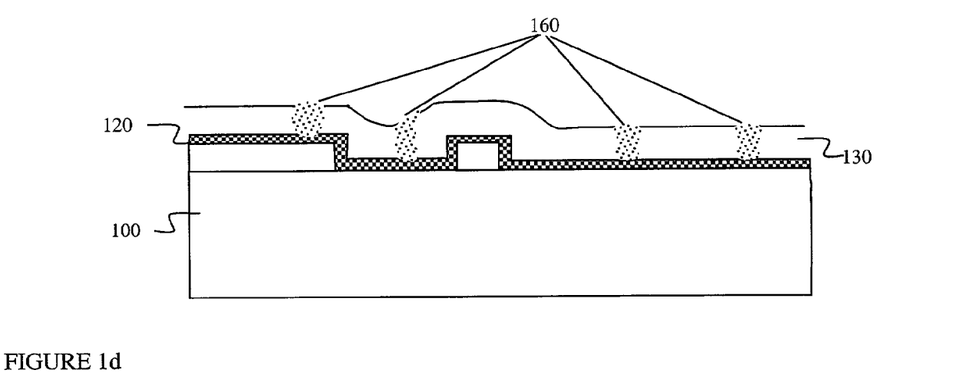

FIG. 1d shows the photoresist layer structure after photoexposure. For purposes of illustration, we have drawn the situation where exposure has induced crosslinking, forming a less soluble region in the photoresist polymer. These crosslinked regions 160 occur wherever a suitable dose from exposure beams 150 has occurred.

Figure 1E:
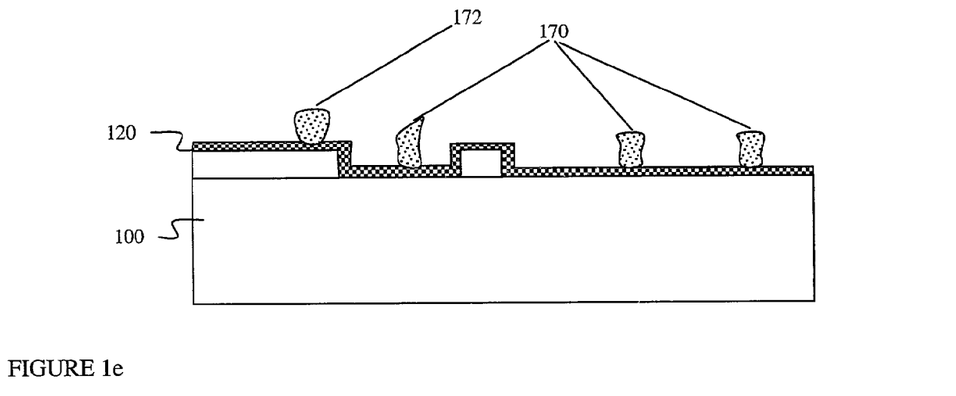

FIG. 1e shows the photoresist after being developed by a suitable solvent. The more soluble photoresist dissolves, leaving behind only isolated resist structures 170 and 172 corresponding to the crosslinked portions of the polymer 160. Note that, where exposure was out of focus, as is the case for the resist feature 172 on top of the topography 110, the feature is considerable wider than the other resist features 170.

Figure 1F:
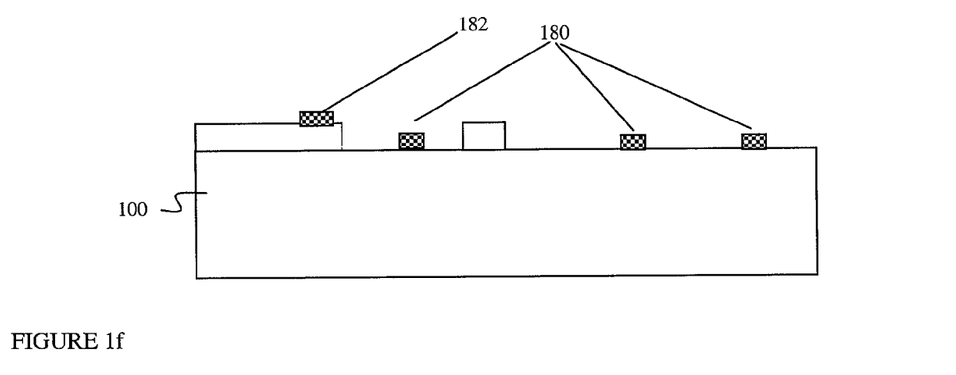

FIG. 1f shows the final result after the pattern is transferred to the layer 120 to be patterned. For this illustration, we use the example of etching the layer 120. Where resist features 170 and 172 are present, the layer 120 is not etched, and only small features 180 and 182 remain. Note that the feature on top of the topography 182 corresponding to the larger resist feature 172 is considerably wider than the other features 180.

The lithography problems illustrated here, of nominally identical features forming non-identical images, and many variations will be known to those skilled in the art of lithography, and need not be illustrated in further detail here.

In Molecular Transfer Lithography, the process of exposure and processing are separated, and carried out as two distinct sets of processing steps. These are shown in FIG. 2 and FIG. 3.

Figure 2A:
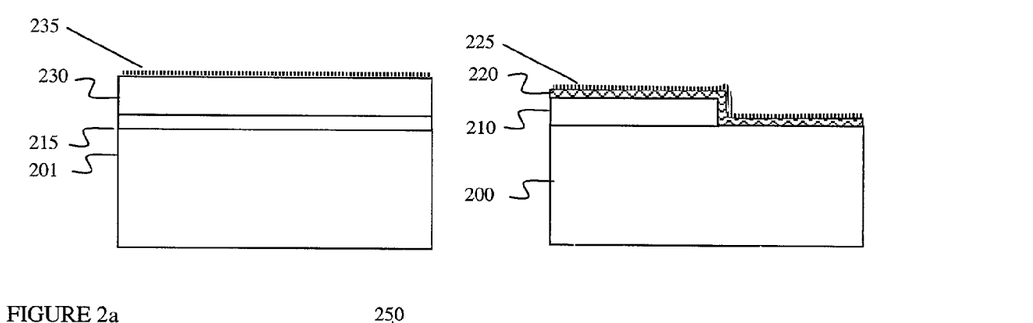
FIG. 2a shows cross section diagrams of the carrier and substrate according to the present invention.

In FIG. 2a, we show in cross section, as we did in FIG. 1, the substrate 200 with topography 210 and a layer 220 of material to be patterned. In this illustration, this also has an additional coating 225 of an adhesion promotion material. However, as also shown in FIG. 2a, a new, planar substrate 201 is prepared. We have called this new substrate a "Carrier" substrate. This substrate 201 can be of any size, but is typically of the same general dimensions as the device to be manufactured. It can be made from any material suitable to the final task of molecular transfer. For general applications, quartz substrates of high quality and good surface figure are easily obtained, while certain plastic substrates might also be used for situations requiring deformation prior to adhesion. Other possible carrier materials are silicon wafers, gallium arsenide wafers, various glasses, and various polymeric materials.

The carrier 201 is coated with several uniform layers: a removal layer 215, a photosensitive coating 230, and an adhesion layer 235. These facilitate respectively removal from the carrier, photosensitivity and the formation of a latent image, and adhesion to the structures on the final substrate 200. The most important property of the layers is that the transfer removal layer 215 (which may be a distinct material or an interface) can be selectively disassociated from coating 230 containing the latent image and that the photosensitive coating 230 remains photosensitive when placed in contact with the other layers. This disassociation may occur either inherently, or with subsequent chemical modification, such as dissolution through the introduction of a solvent.

It is advantageous where the adhesion and removal layers are processed to achieve the desired effect of selective adhesion and removal. For example, the removal layer 215 may begin as a tightly bonded material connecting the photosensitive material 230 to the carrier 201. However, after contact with the substrate 200, a second processing step, such as the introduction of a solvent, can cause the disassociation of the photosensitive material from the carrier 201 through breakdown of the removal layer 215.

The removal layer 215 can comprise nothing, if the surface energy of the resist with the carrier is low enough, or be a layer of a low energy material such as teflon, or a dissolvable material, such as another photoresist or any other dissolvable polymer material. The removal layer 215 may also comprise a material that can change phase, for example from a solid to a liquid, by processing such as thermal effects or absorption of directed radiation. For example, such materials may be waxes or metals, respectively. These materials may be deposited on the carrier surface using standard spin-coating or sputtering techniques. In addition, the removal layer 215 may be the same as the photosensitive coating itself 230 where the transfer occurs by delamination of the photosensitive coating.

The photosensitive coating 230 can be selected from a variety of photosensitive materials, such as commercial polymers that undergo chemical or physical changes when exposed to radiant energy. These are often called photoresists. Both negative and positive photoresists can be used, depending on the specific application.

The adhesion layer 235 must have a higher surface energy when placed in contact with the materials on the substrate 200, so common surface preparations such as hexamethyldisilazane (HMDS) can be used. Curable polymers, such as epoxies or other photoresists, can also be used. If this layer is applied prior to photoexposure, the optical properties of the material must also be considered, since UV absorption by the adhesion layer 235 could affect the exposure dose used. Alternatively, the adhesive layer 235, which can be as simple as a single monolayer of HMDS, may be applied after the exposure step, and UV absorption is less important.

It should be noted that this adhesion layer 235 may comprise nothing, if the relative adhesion properties of the layer 225 and 215 applied onto the substrate and carrier have suitable adhesion properties. It will also be understood by those skilled in the art that the adhesion layer 235 on the carrier and adhesion layer 245 on the substrate must have suitable adhesion properties to each other to promote the eventual adhesion of the photosensitive layer 230 to the substrate after latent image formation. This may also include subsequent processing steps to improve adhesion after the initial contact is made. Such processing steps include thermal processing where the diffusion of the material interfaces can occur to improve bonding, or to facilitate a chemical reaction, such as cross-linking.

Figure 2B:
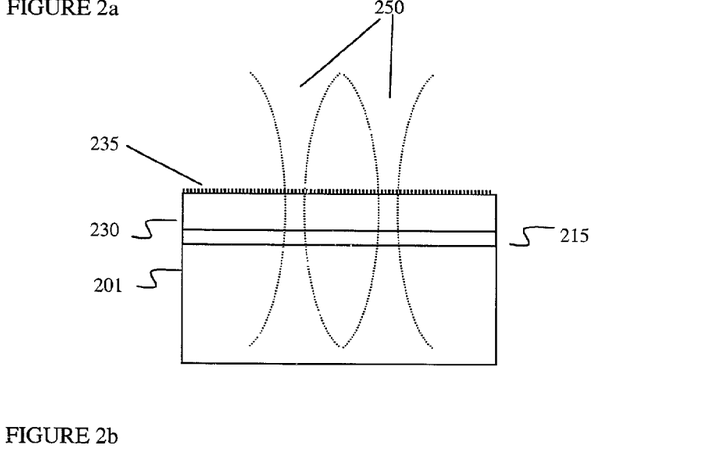
FIGS. 2b–2c illustrate the sequence of steps for photoexposure of the carrier according to the process of the current invention.

To create the lithographic pattern, the carrier 201 with photosensitive coating 230 is exposed to a suitable pattern of radiation 250. This is illustrated in FIG. 2b. Any one of a variety of commonly practiced lithographic techniques can be used. Exposure can be accomplished by contact lithography with a mask and flood UV exposure. It can also be carried out using standard imaging techniques in a standard stepper or scanner, commonly used for IC microfabrication, as long as the stage has an adapter to properly hold and align the coated carrier. Direct write techniques, such as E-beam lithography or other directed energy exposure techniques, can also be used to expose the photosensitive layer 230. Many other exposure techniques will be known to those skilled in the art.

Figure 2C:
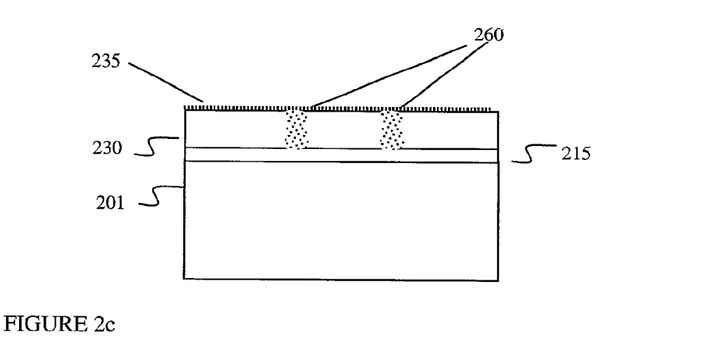

After exposure has occurred, a latent image exists within the photosensitive material. This is illustrated in FIG. 2c. This latent image comprises regions which have been altered by exposure, along with regions which have remained unexposed and unaltered For the purposes of illustration, FIG. 2c shows the exposed regions 260 formed by crosslinking to be less soluble after exposure to the radiation beams 250.

FIG. 3 illustrates the transfer and processing steps of Molecular Transfer Lithography. Here, the carrier 201 with the latent image containing the crosslinked regions 260 is aligned with the substrate 200 using an alignment system 290. The alignment system in FIG. 2c is simple, and those skilled in the art will know many variations of highly precise alignment techniques that can be applied to this situation. The two objects, once aligned, are then brought into physical contact or at least very close physical proximity.

Figure 3A:
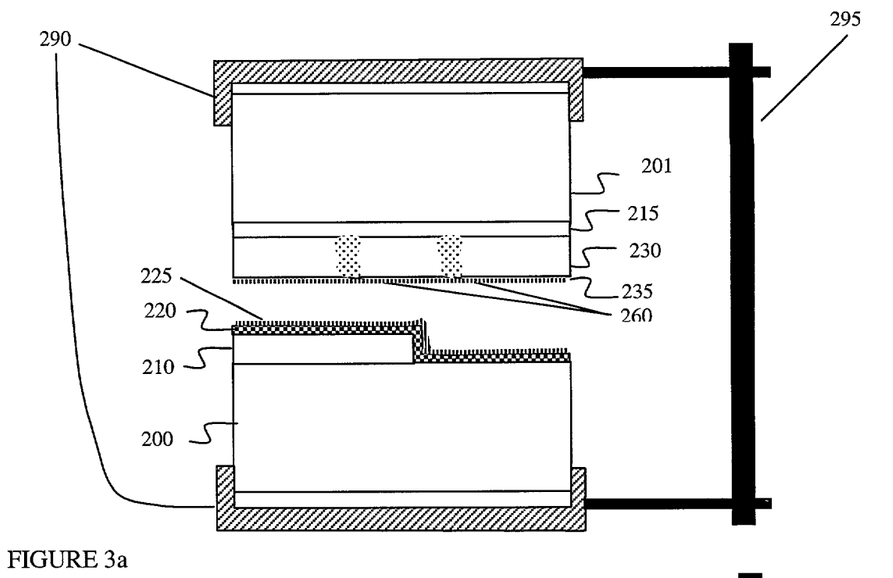
FIGS. 3a–3d show cross section diagrams illustrating the transfer of a latent image from carrier to substrate and the subsequent development of the latent according to the process of the current invention.
Figure 3B:
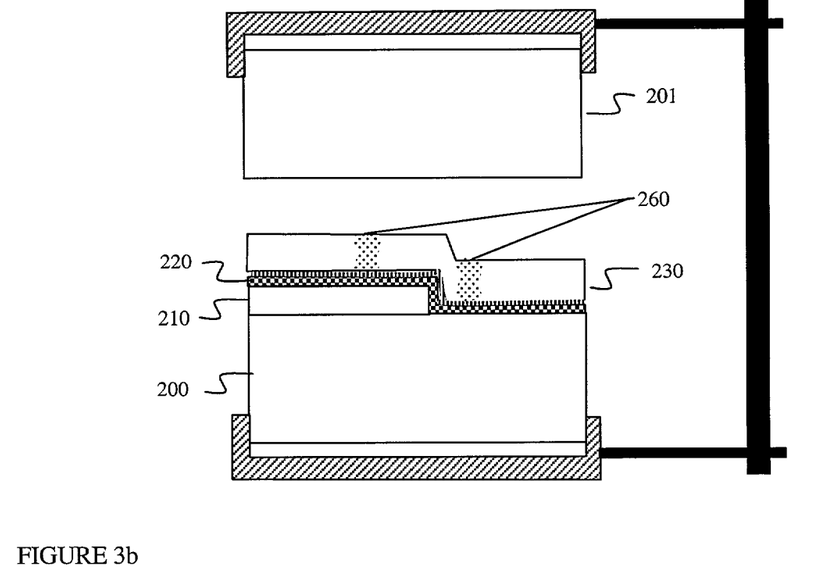

If the carrier adhesion layer 235 and substrate adhesion layer 225 have a suitably larger surface energy relative to the removal layer 215, the layer 230 containing the exposed regions 260 will detach from the carrier 201 and adhere to the substrate 200. This is illustrated in FIG. 3b. The carrier 201, now with no coating, is then removed, leaving the photoresist layer 230 with exposed regions 260 on the substrate 200.

Additional processing steps, along or in combination, can also be used at this point to enhance the transfer of the exposed layer from the carrier to the substrate. Heat can be applied to the pair, to change the relative adhesion properties, or to increase the number of binding or interacting molecules across the interface. Pressure can also be applied. A special gas can be directed to surround the materials, again to affect the relative adhesion properties. Exposure to UV light or other directed energy beams can also be applied at this point, to cause selective photochemistry in some or all of the layers (such as curing an epoxy, for example). The substrate 200 or carrier 201 can also be configured to allow the insertion of a suitable solvent for at least one of the layers, to selectively dissolve a layer binding the latent image to the carrier and therefore promote adhesion to the substrate. In addition, the cohesiveness of the materials may be designed such that removal of the carrier from the film structure may be accomplished by separation (or tearing) of the removal layer. Many other transfer promoting or transfer inhibiting techniques will be known by those skilled in the art.

Figure 3C:
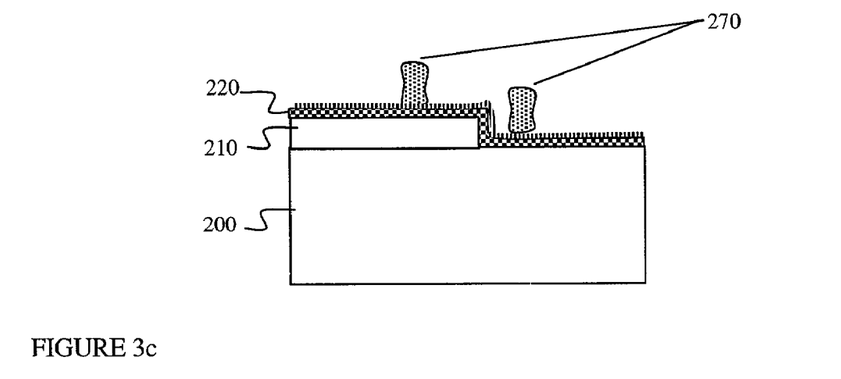

After transfer has successfully occurred, development of the transferred photoresist layer 230 and subsequent processing of the substrate would proceed as in a regular photolithographic process, as shown in FIG. 3c, creating photoresist regions 270 which correspond to the exposed regions 260.

Figure 3D:
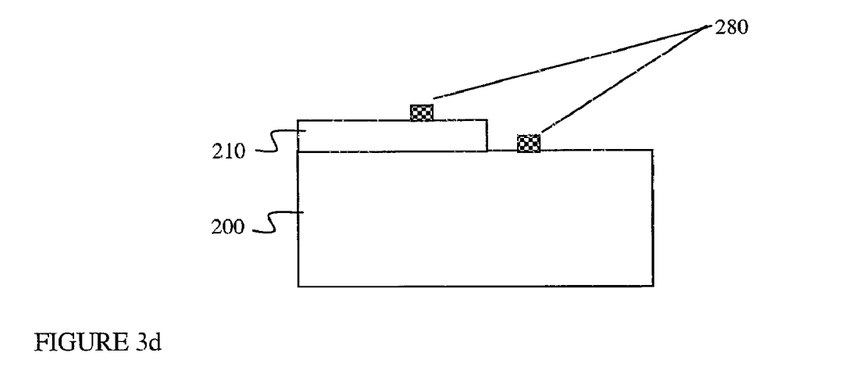

FIG. 3d shows the final patterning of layer 220, in which resist regions 270 form barriers to an etching process, leaving patterned regions 280 that are the same size regardless of the underlying topography, both with and without topography 210

Although originally conceived as a technique for the fabrication of integrated circuits, there are many other applications where this patterning technique can be utilized, for example in the area of organonucleotide sequencing.

Currently, bio-chips containing many variations of organonucleotide sequences are fabricated using sequences of lithography steps. Each patterning step allows the additional attachment of one nucleotide to the sequence. Large sequences in a variety of combinations are built up using masks with complicated array patterns, repeating the steps of exposure, development, nucleotide attachment, resist removal, etc. until the entire array of desired sequences has been produced.

This is very time consuming and tedious. Furthermore, the processing steps, using sequences of masks that must be used in the correct lithographic order, make queueing for exposure tool time a problem for practical production.

This problem is relieved if pre-exposed carriers containing latent images of the masks have been fabricated in advance. Then, to create the appropriate step of the nucleutide sequence, the carrier is simply brought into proximity with the substrate, and the latent image transferred to the substrate. No delay for coating is required, and more importantly, there is no delay for expensive exposure tool time.

Similar queueing advantages may in fact be found in any fabrication technique based on the invention disclosed here, whether they be for bio-chips, integrated circuits, photonic devices, micro-electromechanical systems (MEMS), or other microdevices, as long as a pre-stocked inventory of stable pre-exposed latent images can be effectively stored without aging or contamination problems.

DESCRIPTION OF VARIOUS REDUCTIONS TO PRACTICE

To demonstrate Molecular Transfer Lithography, the following experimental processes were carried out. These are also illustrated in FIGS. 4 through 9.

Figure 4A:
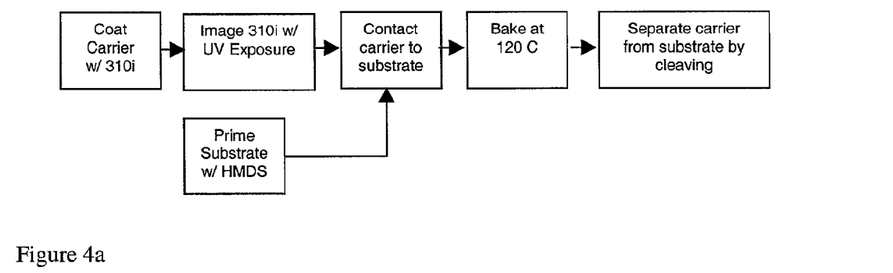
FIG. 4a illustrates the steps taken in an initial reduction to practice.
Figure 4B:
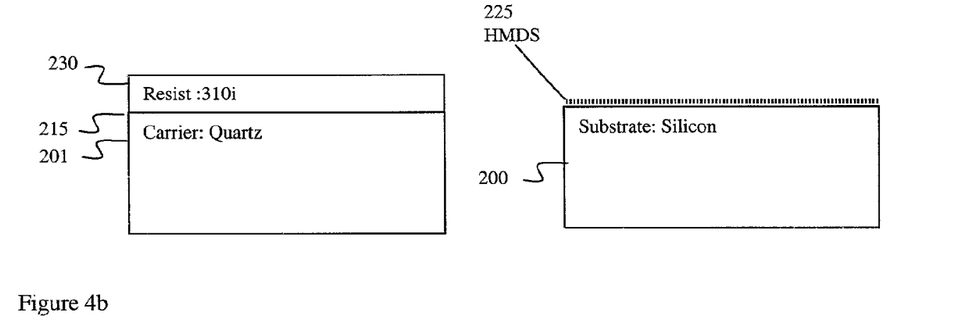
FIG. 4b shows cross section diagrams of the carrier and substrate as prepared in the initial reduction to practice.

For the first reduction to practice, illustrated in FIG. 4, the carrier 201 was a quartz sheet 0.5 mm thick and 25 mm by 25 mm in area. This was coated with Shipley 310i negative photoresist 230 using spin coating at 4000 rpm. Because this material had a suitable surface energy, no additional removal layer 215 was required.

The reductions to practice used a conventional contact or proximity lithography system to generate the latent image. However, those skilled in the art will recognize that many lithographic techniques, including projection lithography systems using reduction lenses, can also be used to implement this invention.

The photoresist was exposed using contact lithography with a mask and flood exposure from a 1 kW Hg(Xe) Arc lamp. The arc lamp was filtered, so only UV light with wavelengths of 220–250 nm exposed the photoresist. The exposure time was 1 second using an Oriel lamp, Model number 66921 which utilizes a UV grade fused silica F/1 condenser. The substrate 200 for this demonstration was a silicon wafer, coated with the adhesion layer. For this example, the adhesive layer 225 was a monomolecular HMDS layer, placed on the surface by standard vapor priming techniques This typically produces a monolayer of the HMDS on the surface.

Figure 4C:
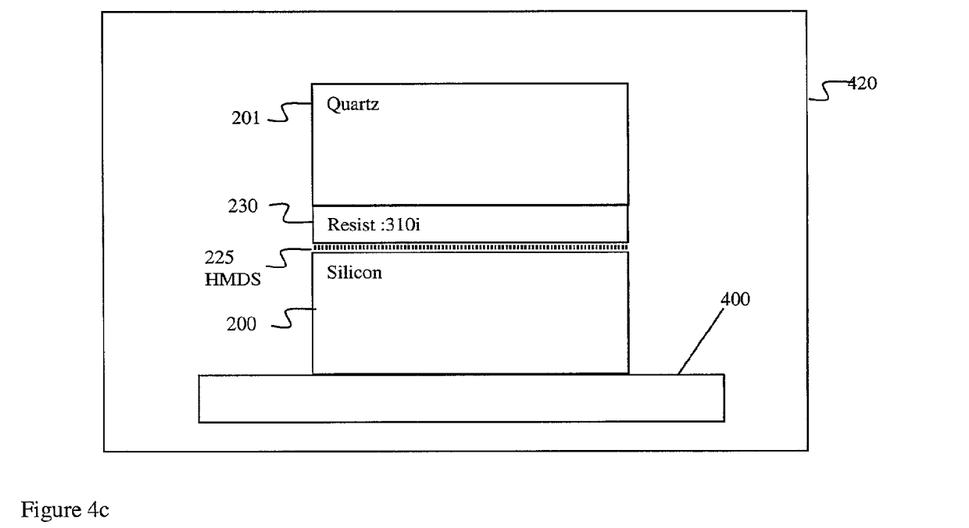
FIG. 4c illustrates the transfer step in the initial embodiment.

After photoexposure, the carrier with the latent image in photoresist was placed in physical contact with the silicon wafer with HMDS. After being placed in contact, the carrier/substrate combination was heated to 120° C. for 90 seconds on a bake plate 400 within an enclosed chamber 420, as shown in FIG. 4c. The carrier was then cleaved from the surface by applying lateral force to the carrier, leaving the entire photoexposed film attached to the silicon wafer. Those skilled in the art will recognize that other more delacate removal methods may also be applied to separate the carrier from the substrate, and that less force is required if suitable adhesion properties are chosen.

Figure 5:
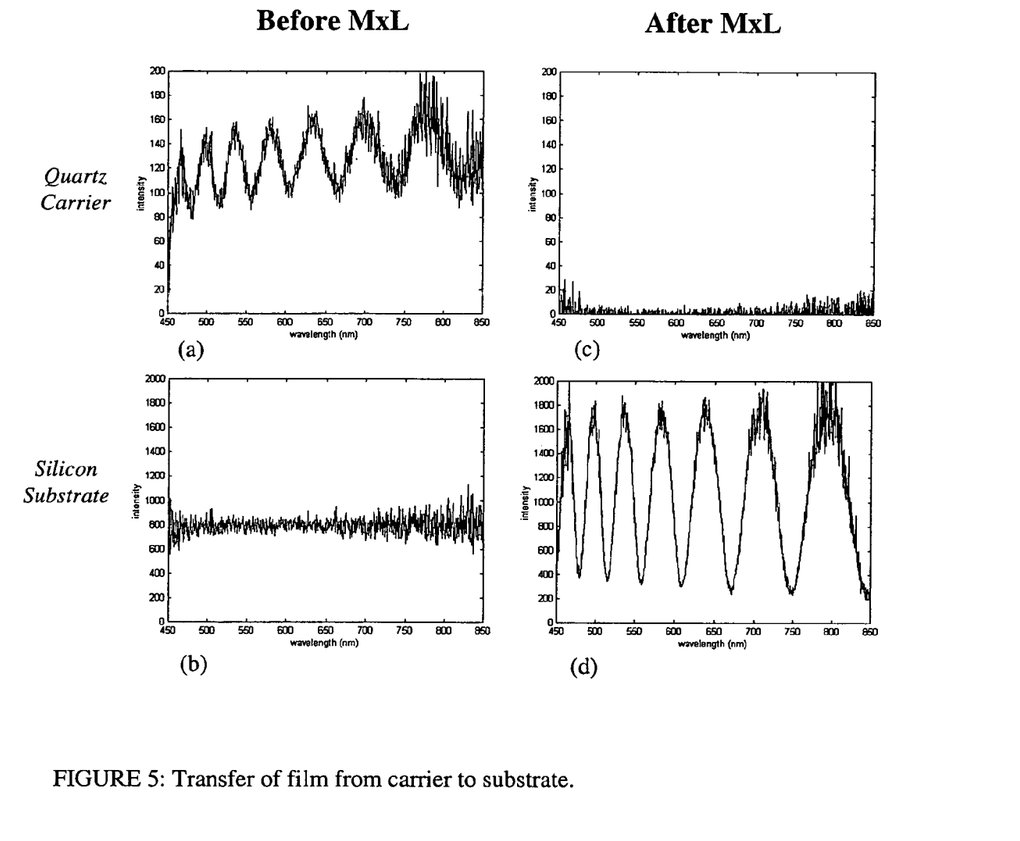
FIGS. 5(a)–5(d) present measurement results that confirm that a film has been transferred using this invention.

In FIG. 5, we depict the measurement of the thin imaged layer of photoresist taken by a spectrometer before and after the transfer. The absence of fringes after transfer indicates the presence of a thin film. The original spectrum in FIG. 5(a) indicates a film is present on the original quartz carrier, while FIG. 5(b) indicates no film is found on the silicon substrate. After transfer, the spectrum in FIG. 5(c) indicates there is no film left on the quartz carrier, while the spectrum in FIG. 5(d) indicates the presence of the film on the silicon substrate.

Figure 6:
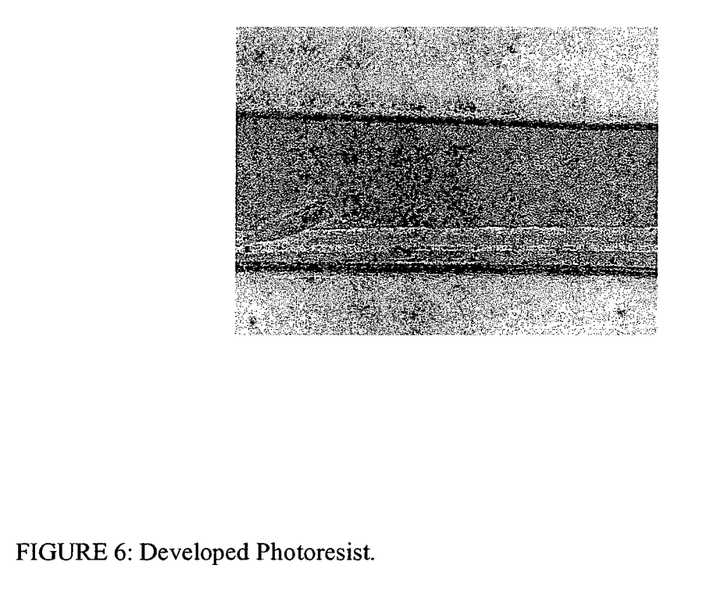
FIG. 6 presents a micrograph of a transferred structure after development.

In FIG. 6, we show an image of the developed photoresist on the substrate taken using an optical microscope with a 50× magnification lens.

Figure 7A:
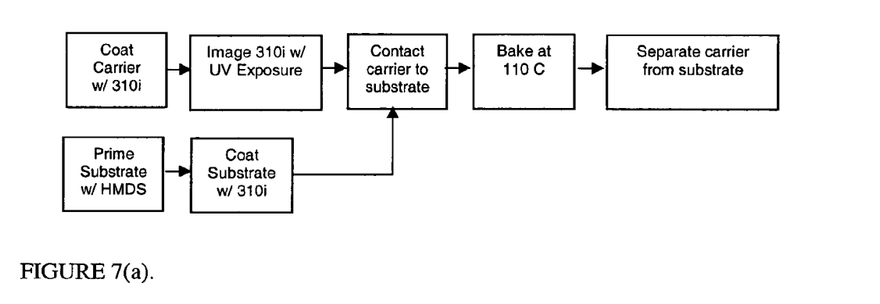
FIGS. 7(a)–7(b) illustrate a second reduction to practice for the invention.
Figure 7B:
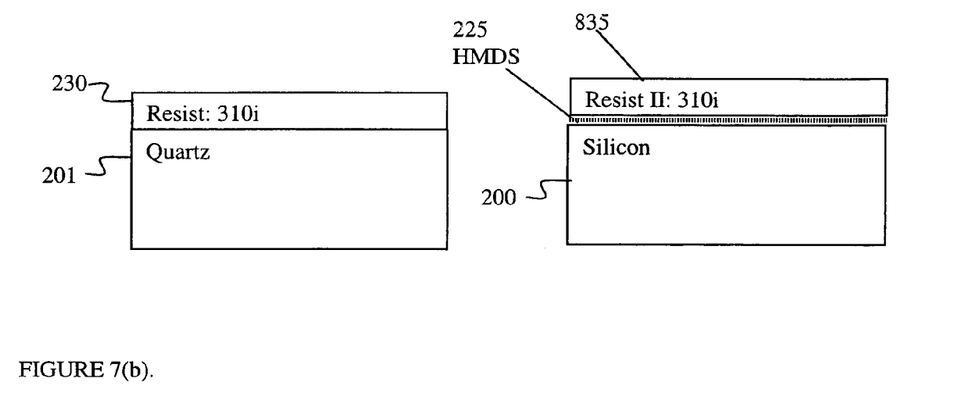

For the second reduction to practice, as illustrated in FIG. 7, a quartz plate and a silicon wafer were again used as the carrier 201 and substrate 200, respectively. After the silicon had been primed with HMDS, however, an additional layer of Shipley 310i photoresist 835 was coated onto the substrate at 4000 rpm using standard spin-coating procedures. The thickness of the photoresist film at this spin-speed is roughly 550 nm. The quartz carrier was exposed using the same conditions as those mentioned in the first reduction to practice. The carrier containing the latent image within its own layer of Shipley 310i photoresist was then brought into contact with the substrate coated with HMDS and Shipley 310i. The combined carrier and substrate were then heated to 110 C. using an enclosed chamber. The quartz carrier was then removed from the wafer. With this method, the transfer occurred within the exposed Shipley 310i, as film remained on the substrate after removal; however the imaged material also was observed on the carrier. This observation indicates a lateral separation within the exposed material, causing it to split. This results in a portion on the wafer and a portion on the quartz carrier itself. The advantage of this method is improved wetting at the substrate and carrier interface, as well as smaller disassociation force required. This method may also be useful for top surface imaging strategies, such as silylation based techniques, of transferring images.

Figure 8A:
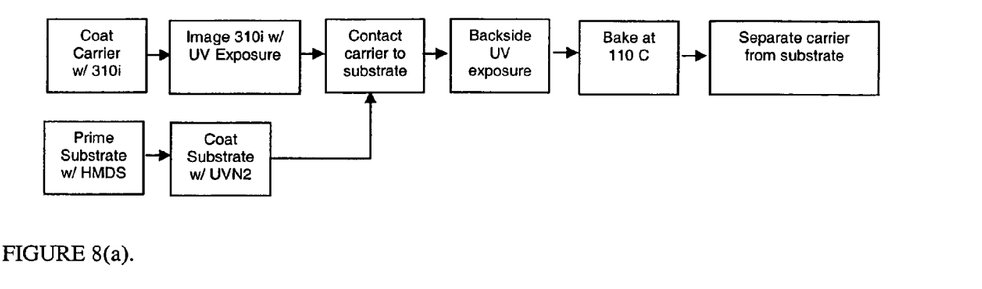
FIGS. 8(a)–8(c) illustrate details of a third reduction to practice for the invention.
Figure 8B:
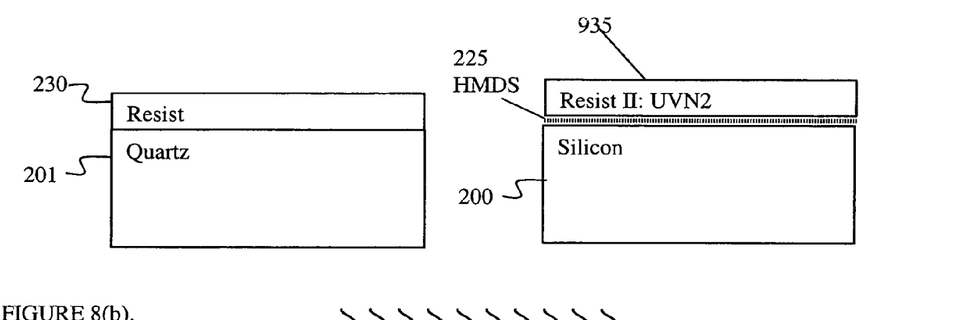
Figure 8C:
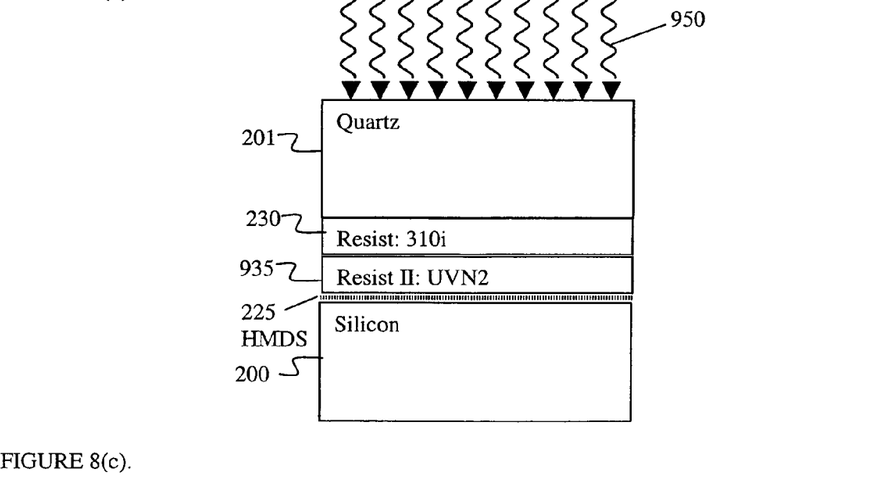

For a third reduction to practice, as illustrated in FIG. 8, a quartz plate with a layer of Shipley 310i was again used as the carrier 201 and photosensitive layer 230 the latent image formed by exposure for 1.0 seconds using the Oriel exposure system previously described. A silicon wafer primed with HMDS was used as the substrate 200. After the silicon had been primed with HMDS, however, an additional layer 935 of Shipley UVN2 photoresist 530 nm thick was added to the substrate by standard spin coating techniques. The quartz carrier containing the latent image within Shipley 310i was then brought into contact with the UVN2 coated substrate. The two adhered structures were then exposed to UV light 950 at wavelengths from 220 nm to 250 nm for 2 seconds as illustrated in FIG. 8(c). The exposure was performed through the back of the quartz carrier 201. The structures were then heated to 110 C. on a conventional hotplate. This results in cross-linking of the material with diffusion across the interface of the imaged material and the UVN2 photoresist on the substrate. After heating the carrier was removed by applying a lateral force to induce a disassociation within the latent image film.

Figure 9A:
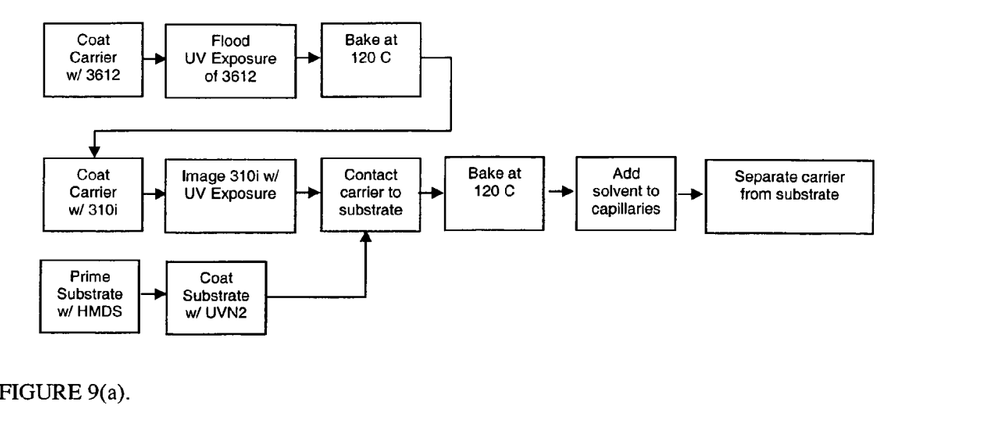
FIGS. 9(a)–9(c) illustrate details of a fourth reduction to practice for the invention.
Figure 9B:
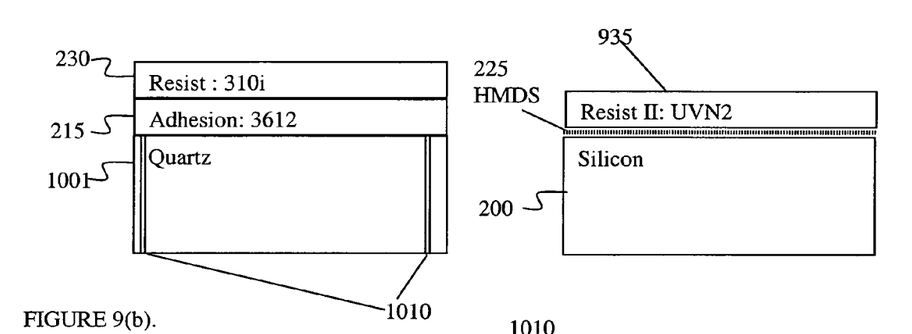
Figure 9C:
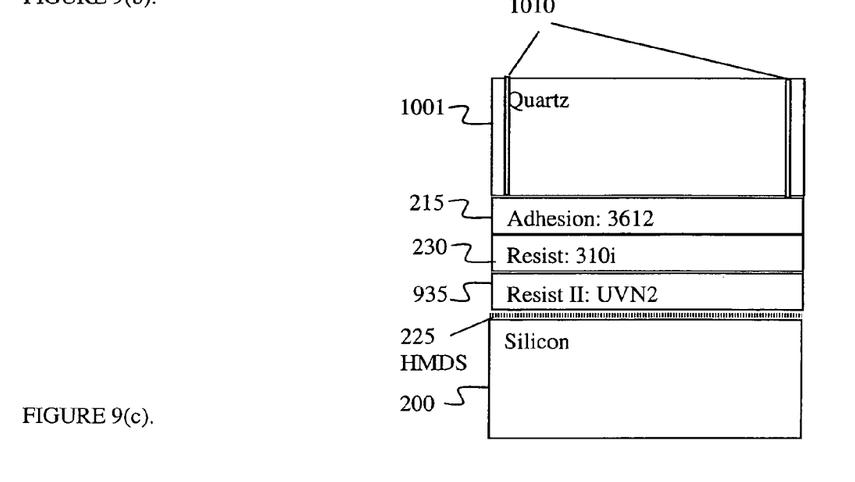
Figure 10A:
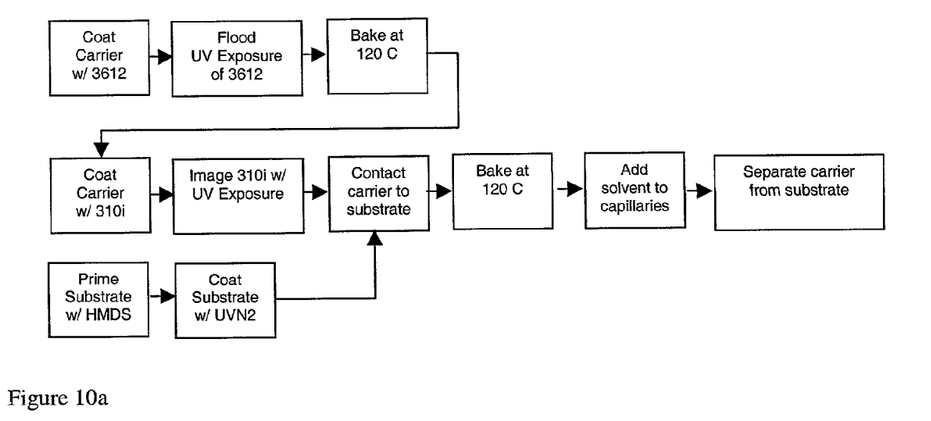
Figure 10B:
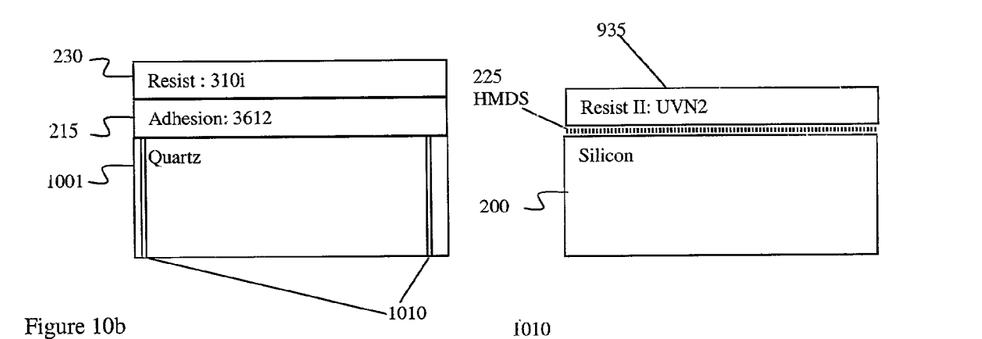
Figure 10C:
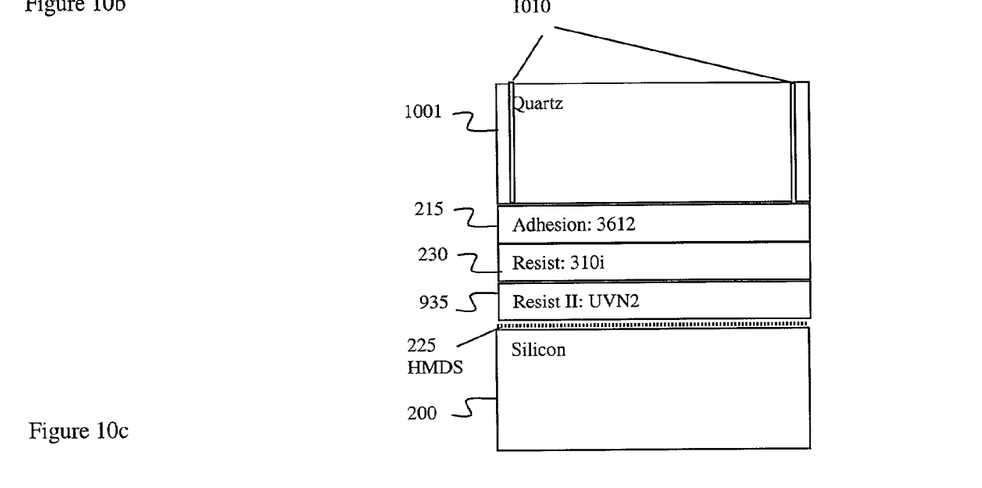

For the fourth reduction to practice, illustrated in FIG. 9, a modified quartz carrier 1001 containing capillary channels 1010 was used as the carrier. This carrier was first coated with an adhesion layer 215 made up of Shipley 3612, a positive photoresist, using spin coating at 4000 rpm to produce a film thickness of 1.7 microns. This was then and was then uniformly exposed to UV radiation at wavelengths from 220–250 nm for 10 seconds. This degraded the photosensitivity of the photoresist and reduced the molecular weight. The quartz carrier with 3612 resist was then baked at 120 C. for 4 minutes. A photosensitive layer 230 of Shipley 310i was then spin coated at 4000 rpm onto the hardened exposed 3612 photoresist. The photosensitive 310i layer was then imaged using a contact lithography procedure, as described above. This carrier was then brought into contact with the silicon substrate. As in the third reduction to practice, above, the surface of the silicon substrate was primed with HMDS and a coated with layer of UVN2 as in the manner previously described. The carrier and the silicon were then heated to 120 C. for 60 seconds.

Disassociation of the carrier from the silicon was achieved by adding a small quantity (two drops) of Shipley LDD26 to a 750 micron capillary channel 1010 within the carrier. To maintain planarity in the region of lithographic interest, the holes in the carrier should be placed to the sides of the carrier, away from the region where transfer will occur. The developer flowed into the hole and within the region between the carrier glass and silicon substrate by capillary action. The previously exposed Shipley 3612 photoresist was then dissolved away. The advantage of this chemical approach is that small disassociation forces are needed to pull the carrier away from the substrate, and the approach is robust with respect to variations in the surface energy of the quartz carrier.

Other methods of achieving this process include first coating the carrier with a standard "top-coat material" such as JSR NFC620 which is typically used as a top antireflective coating. Next, the photoresist layer is coated onto the carrier. The top-coat materials are typically water soluble, do not mix with the photoresist, and are transparent. All of these are desirable properties. After the photoresist is imaged and contacted to the surface of the substrate, water may be added to the structure. Because the photoresist is insoluble in water, only the top-coating layer is weakened. This aids in lowering the forces needed to remove the carrier from the latent image, and thus disturbing the latent image.

While specific materials, coatings, carriers, substrates, and process steps have been set forth to describe and exemplify this invention and its preferred embodiment, such descriptions are not intended to be limiting. Modifications and changes may be apparent to those skilled in the art, and it is intended that this invention be limited only by the scope of the appended claims.

I claim:

1. A process for patterning a substrate comprising the steps of:
   coating a carrier with a photosensitive material,
   exposing the photosensitive material to a pattern of radiation, and
   physically transferring the exposed material to the substrate.

2. The process of claim 1, further comprising the step of developing the exposed photosensitive material after the material has been transferred to the substrate.

3. The process of claim 2, in which the substrate is a curved surface, and the carrier is manufactured from a flexible material.

4. The process of claim 1, in which the carrier is fabricated from the group of materials consisting of quartz, glass, silicon dioxide, silicon nitride, sodium chloride, silicon, and gallium arsenide.

5. The process of claim 1, in which the carrier is fabricated from a polymeric material.

6. The process of claim 1, in which the photosensitive material is a photoresist.

7. The process of claim 1, in which the exposure step comprises exposure to UV photons.

8. The process of claim 1, in which the photosensitive material is sensitive to electron beam exposure, and the exposure step comprises exposure to electron beams.

9. The process of claim 1, further comprising the step of coating the photosensitive material on the carrier with an adhesion layer.

10. The process of claim 9, in which a removal layer is formed between the carrier and the photosensitive material.

11. The process of claim 10, in which the adhesion layer comprises multiple layers.

12. The process of claim 1, further comprising the step of coating the substrate with an adhesion layer.

13. The process of claim 12, in which a removal layer is formed between the carrier and the photosensitive material.

14. The process of claim 12, in which the adhesion layer comprises multiple layers.

15. The process of claim 14, further comprising the step of coating the photosensitive material with an additional adhesion layer.

16. The process of claim 15, in which the additional adhesion layer comprises multiple layers.

17. The process of claim 1 in which the transfer of the photosensitive material to the substrate comprises bringing the carrier with the material in close physical proximity to the substrate and pressing the carrier, substrate, and intervening films together.

18. The process of claim 17, in which the carrier and the substrate are heated above room temperature while in close physical proximity.

19. The process of claim 17, in which the carrier and substrate are exposed to radiation while in close physical proximity.

20. The process of claim 19, in which the radiation comprises UV photons.

21. The process of claim 17, in which a solvent is introduced to dissolve a part of the intervening films.

22. The process of claim 17, further comprising the step of alignment between the carrier and the substrate.

23. The process of claim 17, further comprising the step of alignment between the exposed material and the substrate.

24. The process of claim 2, further comprising the step of etching the substrate after the exposed photosensitive material has been developed.

* * * * *